(12) United States Patent
Nemoto et al.

(10) Patent No.: US 11,217,422 B2
(45) Date of Patent: Jan. 4, 2022

(54) CHARGED PARTICLE BEAM SYSTEM AND METHOD OF MEASURING SAMPLE USING SCANNING ELECTRON MICROSCOPE

(71) Applicant: JEOL Ltd., Tokyo (JP)

(72) Inventors: Yoshikazu Nemoto, Tokyo (JP); Yuta Murakami, Tokyo (JP); Takakuni Maeda, Tokyo (JP); Akira Abe, Tokyo (JP); Masatsugu Kawamoto, Tokyo (JP); Hiroki Mezaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/776,039

(22) Filed: Jan. 29, 2020

(65) Prior Publication Data

US 2020/0251302 A1    Aug. 6, 2020

(30) Foreign Application Priority Data

Feb. 1, 2019    (JP) .............................. JP2019-017034

(51) Int. Cl.
*H01J 37/22* (2006.01)
*H01J 37/20* (2006.01)
*H01J 37/28* (2006.01)

(52) U.S. Cl.
CPC ............ *H01J 37/20* (2013.01); *H01J 37/222* (2013.01); *H01J 37/226* (2013.01); *H01J 37/28* (2013.01); *H01J 2237/2007* (2013.01); *H01J 2237/20285* (2013.01); *H01J 2237/221* (2013.01); *H01J 2237/226* (2013.01); *H01J 2237/24578* (2013.01)

(58) Field of Classification Search
CPC .............................. H01J 37/222; H01J 37/226
See application file for complete search history.

(56) References Cited

U.S. PATENT DOCUMENTS

| | | | |
|---|---|---|---|
| 2005/0230636 A1 | 10/2005 | Tanaka et al. | |
| 2007/0045537 A1* | 3/2007 | Joseph .................... | H01J 37/28 250/310 |
| 2008/0265158 A1 | 10/2008 | Iwasaki | |
| 2008/0315097 A1 | 12/2008 | Tanaka et al. | |
| 2012/0074317 A1 | 3/2012 | Diemer et al. | |
| 2015/0144804 A1 | 5/2015 | Ando et al. | |

(Continued)

FOREIGN PATENT DOCUMENTS

| | | |
|---|---|---|
| DE | 102010046902 A1 | 3/2012 |
| GB | 2484197 A | 4/2012 |

(Continued)

OTHER PUBLICATIONS

Extended European Search Report issued in EP20154134.9 dated Jul. 13, 2020.
Office Action issued in JP2019017034 dated Mar. 2, 2021.

*Primary Examiner* — Eliza W Osenbaugh-Stewart
(74) *Attorney, Agent, or Firm* — The Webb Law Firm

(57) ABSTRACT

First shape data representing a three-dimensional shape of a sample unit including a sample is generated based on a result of three-dimensional shape measurement of the sample. Second shape data representing a three-dimensional shape of a structure which exists in a sample chamber is generated. Movement of the sample unit is controlled based on the first shape data and the second shape data such that collision of the sample unit with the structure does not occur.

8 Claims, 10 Drawing Sheets

(56) References Cited

U.S. PATENT DOCUMENTS

| | | | |
|---|---|---|---|
| 2019/0103245 A1 | 4/2019 | Van Der Mast et al. |
| 2019/0148105 A1 | 5/2019 | Koyanagi et al. |
| 2019/0259568 A1 | 8/2019 | Suzuki |

FOREIGN PATENT DOCUMENTS

| | | | |
|---|---|---|---|
| JP | 8153483 A | 8/1996 |
| JP | 2006331852 A | 12/2006 |
| JP | 2008270072 A | 11/2008 |
| JP | 2010135335 A | 6/2010 |
| JP | 201218817 A | 1/2012 |
| JP | 5537737 B2 | 5/2014 |
| JP | 201493283 A | 5/2014 |
| JP | 201537028 A | 2/2015 |
| JP | 2019145304 A | 8/2019 |
| WO | 2017216941 A1 | 12/2017 |

* cited by examiner

FIG. 7

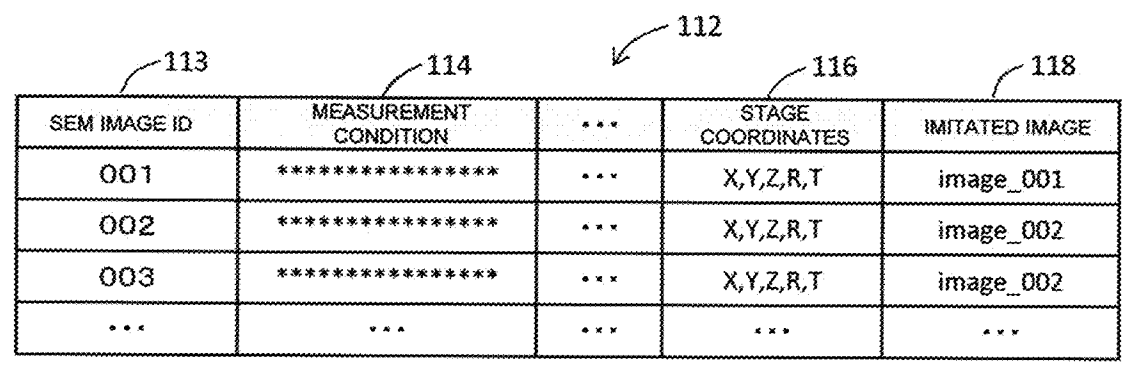

| SEM IMAGE ID | MEASUREMENT CONDITION | ... | STAGE COORDINATES | IMITATED IMAGE |
|---|---|---|---|---|
| 001 | ***************** | ... | X,Y,Z,R,T | image_001 |
| 002 | ***************** | ... | X,Y,Z,R,T | image_002 |
| 003 | ***************** | ... | X,Y,Z,R,T | image_002 |
| ... | ... | ... | ... | ... |

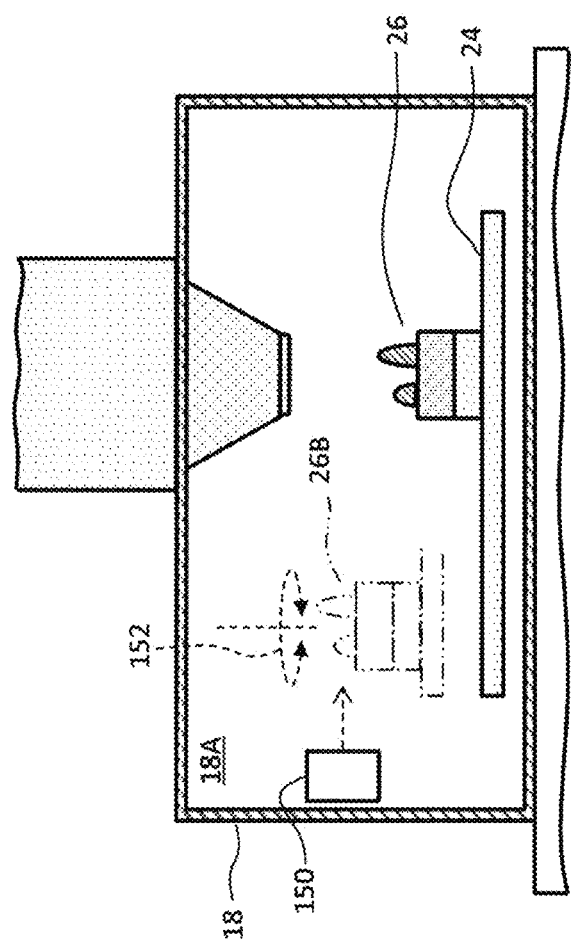

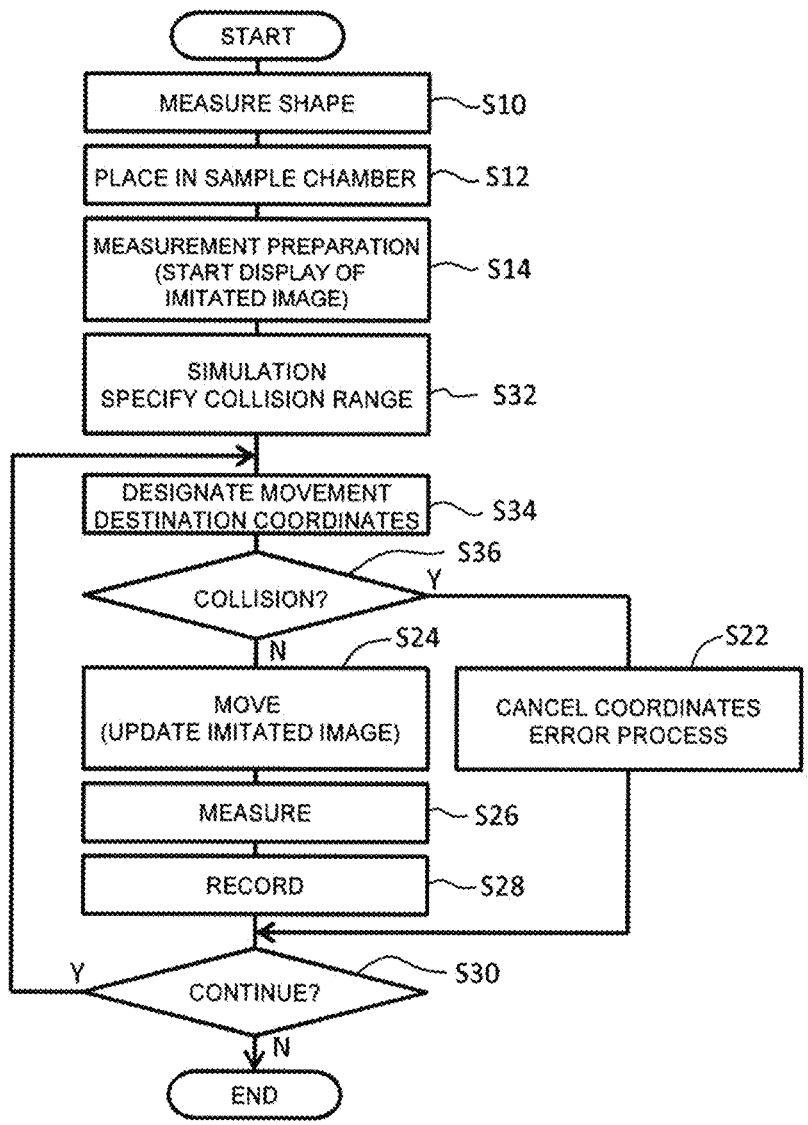

CHARGED PARTICLE BEAM SYSTEM AND METHOD OF MEASURING SAMPLE USING SCANNING ELECTRON MICROSCOPE

CROSS REFERENCE TO RELATED APPLICATION

This application claims priority to Japanese Patent Application No. 2019-017034 filed Feb. 1, 2019, the disclosure of which is hereby incorporated by reference in its entirety.

BACKGROUND OF THE INVENTION

Field of the Invention

The present disclosure relates to a charged particle beam system and a method of measuring a sample using a scanning electron microscope, and in particular to control of movement of a sample in a sample chamber.

Description of Related Art

A charged particle beam system is a system which measures a sample using charged particles such as electrons and ions. As a typical system, there is known a scanning electron microscope system. The scanning electron microscope system is formed as a single entity of a scanning electron microscope apparatus or as a combination of the scanning electron microscope apparatus and other apparatuses.

In the scanning electron microscope apparatus, prior to observation of a sample, a sample unit comprising a sample and a holder is placed on a stage in a sample chamber. The stage comprises, for example, an elevating/lowering mechanism, a tilt mechanism, a first horizontal movement mechanism, a second horizontal movement mechanism, a rotation mechanism, or the like. In general, during observation of the sample, the sample is moved close to an objective lens.

In a charged particle beam apparatus described in JP 5537737 B, an optical image of a sample is combined with a pseudo-image of the sample stage, to produce a combined image. The combined image does not reflect a three-dimensional shape of the sample. In a charged particle beam apparatus described in JP 2014-93283 A, a size of the sample is computed. The size is considered to be a size of a cylinder surrounding the overall sample. An actual three-dimensional shape of the sample is not measured.

In a charged particle beam system, when the sample unit is moved within the sample chamber, it is desired to avoid collision of the sample unit (in particular, the sample) with structures existing in the sample chamber. For this purpose, in the related art, a movement condition of the sample that will not cause the collision, is determined based on a maximum height of the sample, which is input by a user. However, this determination does not take into consideration the actual three-dimensional shape of the sample. According to the related art described above, problems may arise such as occurrence of a collision due to erroneous input of the maximum height, user load involved with the input of the maximum height, and the sample not being moved closer to the objective lens although the situation permits such movement of the sample closer to the objective lens.

An advantage of the present disclosure lies in realization of control of a movement of a sample in consideration of a three-dimensional shape of the sample, in a charged particle beam system.

SUMMARY

According to one aspect of the present disclosure, there is provided a charged particle beam system comprising: a first shape data generating means that generates first shape data which represents a three-dimensional shape of a sample based on a result of three-dimensional shape measurement of the sample; a sample chamber inside which a sample unit including the sample is placed, for measurement by a charged particle beam; a second shape data generating means that generates second shape data which represents a three-dimensional shape of a structure which exists in the sample chamber; and control means that controls movement of the sample unit in the sample chamber based on the first shape data and the second shape data.

According to the structure described above, the movement of the sample unit can be controlled based on the three-dimensional shape of the sample and the three-dimensional shape of the structure. Thus, for example, when it is expected that the sample unit will move close to or collide with the structure, the movement of the sample unit may be restricted, or a positioning of the sample unit can be optimized. Specifically, it becomes easier to move the sample closer to the objective lens. If the input of the sample height by the user becomes unnecessary, the load of the user can be reduced.

In the above-described structure, the three-dimensional shape of the sample does not mean a three-dimensional shape of a three-dimensional figure surrounding the entire sample, but rather means a specific three-dimensional shape of the sample or an actual three-dimensional shape of the sample. For example, when the sample is formed from a plurality of sample elements, the three-dimensional shape of the sample is measured so that at least an overall form of each individual sample element can be individually identified. When it is desired to control the movement with high precision, the three-dimensional shape of the sample is measured with high precision.

According to another aspect of the present disclosure, the control means controls the movement of the sample unit in the sample chamber such that the sample unit does not collide with the structure. According to this configuration, the collision of the sample unit with the structure is avoided. The concept of the movement includes a change of a position and a change of an orientation. The three-dimensional shape measurement of the sample may be executed outside of the sample chamber or inside the sample chamber. Alternatively, the three-dimensional shape measurement of the sample may be executed in a space adjacent to the sample chamber.

According to another aspect of the present disclosure, the control means comprises: simulation means which executes a simulation for virtually trying movement of the sample unit based on movement information of the sample unit prior to movement of the sample unit in the sample chamber; and determining means which determines collision of the sample unit with the structure based on a result of execution of the simulation, and, when the collision is determined, movement of the sample unit is prohibited. According to this configuration, even when the sample unit and the structure have complex forms or even when the movement of the sample unit is complex, the collision can be determined relatively easily. Alternatively, a theoretical collision may be determined in consideration of a certain margin. The concept of the movement information of the sample unit includes movement information of the stage.

According to another aspect of the present disclosure, the first shape data is data which represents a three-dimensional shape of the sample unit which is formed from the sample and a holder which holds the sample. In general, the sample is handled along with a holder which carries the sample.

Thus, it is reasonable to handle the shape data with the sample unit as a unit. Normally, a plurality of types of the holders are prepared, and a holder selected from these types is used. In consideration of this, a plurality of shape data may be prepared corresponding to the plurality of types of the holders, and shape data selected from these plurality of shape data may be used to generate the first shape data.

According to another aspect of the present disclosure, the structure includes at least one standard element which is fixedly placed in the sample chamber. For example, in the scanning electron microscope system, a backscattered electron detector, a secondary electron detector, or the like may be exemplified as the standard element. The stage, an inner wall of the sample chamber, or the like may additionally be set as the standard element.

According to another aspect of the present disclosure, a group of ports are provided in the sample chamber, one or a plurality of optional elements are provided on one or a plurality of used ports selected from among the group of ports during use of an optional element, and the structure includes the one or the plurality of optional elements during the use of the optional element. According to the above-described configuration, when one or a plurality of optional elements are used, the second shape data can be generated in consideration of the optional element(s), and the movement of the sample unit can be controlled based thereon. In other words, when the optional element is used, collision of the sample unit with the optional element can be prevented. For example, in the scanning electron microscope system, an X-ray detector, a nozzle, or the like may be exemplified as the optional element.

According to another aspect of the present disclosure, the charged particle beam system further comprises: a first storage unit that stores a plurality of shape data which represent three-dimensional shapes of a plurality of standard elements which are fixedly placed in the sample chamber; a second storage unit that stores a plurality of shape data which represent three-dimensional shapes of a plurality of optional elements which can be installed on the group of ports; and a third storage unit that stores a port management table for managing one or a plurality of used ports selected from among the group of ports, and for managing one or a plurality of optional elements installed on the one or the plurality of used ports, wherein the second shape data generating means generates the second shape data by referring to the first storage unit, the second storage unit, and the third storage unit. According to this configuration, the second shape data is generated as an assembly of a plurality of shape data. In particular, with this configuration, the port being used and the optional element being used can be specified, to generate the second shape data which matches the actual form and which is accurate.

According to another aspect of the present disclosure, the charged particle beam system further comprises: imitated image generating means that generates an imitated image which shows a spatial relationship between the structure and the sample unit, based on movement information of the sample unit, the first shape data, and the second shape data, and display means that displays the imitated image. According to this structure, the imitated image which represents the inside of the actual sample chamber can be provided to the user.

According to another aspect of the present disclosure, the imitated image generating means updates the imitated image according to update of the movement information of the sample unit. The imitated image may be updated immediately after input of the movement information, or may be updated after the movement of the sample unit. Alternatively, the imitated image may be updated in real time during the movement of the sample unit.

According to another aspect of the present disclosure, the imitated image includes a sample unit object corresponding to the sample unit and a structure object corresponding to the structure, and, when collision between the sample unit and the structure is determined prior to the movement of the sample unit, the imitated image generating means reflects a result of the determination in at least one of the sample unit object and the structure object. According to this configuration, a predicted collision can be visually recognized beforehand, and thus, it becomes easier to take a countermeasure for the collision beforehand. For example, the sample may be re-machined, the holder may be exchanged, or an optional detector may be removed, based on a colliding part.

According to another aspect of the present disclosure, there is provided a method of measuring a sample using a scanning electron microscope, the method comprising: executing three-dimensional shape measurement of a sample before or after a sample unit including the sample is placed inside a sample chamber of a scanning electron microscope; generating first shape data which represents a three-dimensional shape of the sample based on a result of the three-dimensional shape measurement; generating second shape data which represents a three-dimensional shape of a structure which exists in the sample chamber; controlling movement of the sample unit in the sample chamber based on the first shape data and the second shape data; and observing the sample using an electron beam after movement of the sample unit in the sample chamber.

BRIEF DESCRIPTION OF DRAWINGS

Embodiment(s) of the present disclosure will be described based on the following figures, wherein:

FIG. 7 is a diagram showing an example of an image management table;

FIG. 12 is a diagram showing an alternative configuration of a method of measuring a shape; and FIG. 13 is a flowchart showing a second example operation.

DESCRIPTION OF THE INVENTION

An embodiment of the present disclosure will now be described with reference to the drawings.

Figure 1:
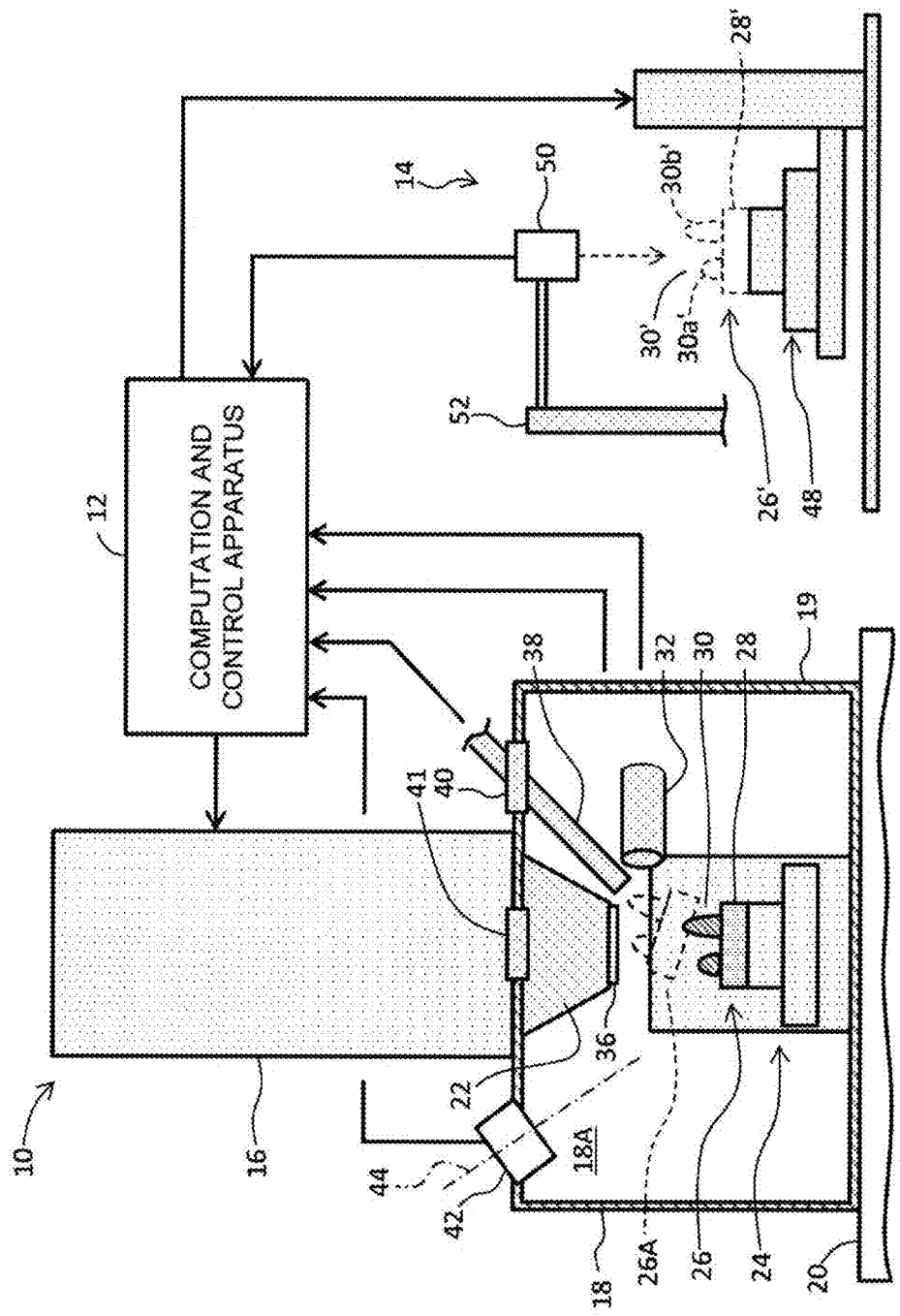
FIG. 1 is a schematic diagram showing an example structure of a charged particle beam system according to an embodiment of the present disclosure.

FIG. 1 shows an example structure of a charged particle beam system according to an embodiment of the present disclosure. In the structure exemplified in the figures, the charged particle beam system is a scanning electron microscope system. Alternatively, the structure described below may be applied to an ion irradiation system or the like.

The scanning electron microscope system is a system for measuring and observing a sample using an electron beam. In the structure exemplified in the figures, the scanning electron microscope system comprises a scanning electron microscope 10, a computation and control apparatus 12, and a shape measurement apparatus 14. The scanning electron microscope 10 serving as a measurement unit and the computation and control apparatus 12 serving as an information processor correspond to a scanning electron microscope apparatus. The computation and control apparatus 12 in the present embodiment has a function to control operations of the scanning electron microscope 10 and the shape measurement apparatus 14. Alternatively, as will be described later, the shape measurement apparatus 14 may be incorporated into the scanning electron microscope 10.

The scanning electron microscope 10 has a lens-barrel unit 16 serving as an upper part, and a sample chamber 18 serving as a lower part. The lens-barrel unit 16 and the sample chamber 18 are physically integrated. The sample chamber 18 is placed on a table 20. In the lens-barrel unit 16, an electron gun, a lens system, a scanning coil, or the like is placed. An objective lens 22 is provided at a lower end of the lens-barrel unit 16. In the actual structure, a lower end portion of the objective lens 22 enters the sample chamber 18. Illustration of a power supply unit, a pump, or the like is omitted.

The sample chamber 18 has a housing 19 serving as a casing. An inside of the housing 19 is an internal space 18A. In the sample chamber 18; that is, in the internal space 18A, a stage 24 and a sample unit 26 are placed. More specifically, the sample unit 26 is attached on the stage 24, and is held by the stage 24. The stage 24 comprises, for example, an elevating/lowering mechanism, a tilt mechanism, a first horizontal movement mechanism, a second horizontal movement mechanism, a rotation mechanism, or the like. The stage 24 is a mechanism which moves the sample unit, and a position and an orientation of the sample unit 26 are determined by the stage 24. In FIG. 1, the mechanisms of the stage 24 are shown schematically or in a simplified manner.

The sample unit 26 includes a holder 28 which forms a base, and a sample 30 held by the holder 28. The sample 30 is a measurement target or an observation target. In general, the sample 30 is formed from a plurality of sample elements. The sample elements are held by the holder 28 or adhered on the holder 28. In general, each individual sample element itself may be considered a sample. From such a point of view, the sample 30 formed from the plurality of sample elements may also be considered to be a group of samples. The shapes of the individual sample elements are diverse. For example, as exemplified in FIG. 1, a sample element which significantly protrudes from an upper surface of the holder 28 may be the measurement target.

A backscattered electron detector 36 is provided in the sample chamber 18. More specifically, the backscattered electron detector 36 is provided on a bottom surface of the objective lens or near the bottom surface. In addition, a secondary electron detector 32 is provided in the sample chamber 18. The detectors 32 and 36 are fixedly placed, and correspond to standard elements to be described later. Additionally or alternatively, an inner wall of the sample chamber, the stage, or the like may be handled as the standard element.

A plurality of ports 40 and 41 are provided on the housing 19. The number of the ports is, for example, 6. One or a plurality of used ports are selected from the group of ports as necessary, and one or a plurality of optional elements are attached to the used port(s). As the optional elements, an energy dispersive X-ray spectrometer (EDS), a wavelength dispersive spectrometer (WDS), an electron backscattered diffraction detector (EBSD), or the like may be exemplified. In FIG. 1, an optional detector 38 is provided on the port 40. A tip (detection end) of the optional detector 38 is positioned in the sample chamber 18. In the configuration exemplified in the figures, the port 41 is a non-used port.

A camera 42 is provided on the housing 19 as necessary. In the configuration exemplified in the figures, the camera 42 is placed with its center axis 44 in an inclined state. The camera 42 is, for example, a CCD camera. During imaging of the sample 30, the position and the orientation of the sample unit 26 are adjusted so that the center axis 44 passes through a center of an upper surface of the holder 28, and the upper surface of the holder 28 is orthogonal to the central axis 44. For example, in a measurement preparation step before measurement, the sample 30 is imaged. Other cameras for observing the sample unit 26 or the like during the measurement are also provided in the housing 19, but are not shown in the figures.

In the observation or measurement of the sample 30, the sample 30 is moved close to the objective lens 22. At the same time, the orientation of the sample 30 is set to that suited for the observation or the measurement (for example, refer to reference numeral 26A). When an SEM image of the sample 30 is acquired, in a state where the position and the orientation of the sample 30 are maintained, an electron beam is irradiated and scanned with respect to the sample 30. When another part is to be observed, the position and the orientation of the sample are changed.

Detection signals which are output from a plurality of the detectors 32, 36, 38, or the like are sent to the computation and control apparatus 12. A picture signal from the camera 42 is also sent to the computation and control apparatus 12. A plurality of control signals are supplied from the computation and control apparatus 12 to the scanning electron microscope 10. These control signals include a control signal for movement of the stage 24.

Next, the shape measurement apparatus 14 will be described. The shape measurement apparatus 14 is an apparatus for measuring a three-dimensional shape of a sample unit 26' before the sample unit 26' is placed in the sample chamber 18. The sample unit 26' is formed from a holder 28' and a sample 30', and, of these elements, a three-dimensional shape of at least the sample 30' is measured. Alternatively, a three-dimensional shape of an entirety of the sample unit 26' may be measured.

As a measurement scheme of the three-dimensional shape, various schemes may be employed. For example, when a focus method which is known is used, as shown in FIG. 1, the sample unit 26' is placed on a base 48, and a camera 50 is placed immediately above the sample unit 26'. While a distance between the camera 50 and the sample 30' is changed, the sample 30' is imaged at each distance. Based on a group of images acquired by the imaging, the three-dimensional shape of the sample 30' is computed, and shape data representing the three-dimensional shape is generated.

In this measurement, a height of the base 48 may be stepwise changed, or a height of the camera 50 may be stepwise changed. The camera 50 is supported by a supporting mechanism 52. Alternatively, the three-dimensional shape of the sample 30' may be measured by scanning of laser light. In this case, the laser light may be irradiated from a horizontal direction to the sample unit 26'. Alternatively, a turntable which rotates the sample unit 26 may be used.

As described above, in general, the sample 30' is formed from a plurality of sample elements 30a' and 30b'. For example, the sample 30' is formed from 6 sample elements. Alternatively, the sample 30' may be formed from one sample element. The three-dimensional shape of the sample 30' is measured so that at least each individual sample element 30a' and 30b' can be identified. For a movement control with high precision, the three-dimensional shape of the sample 30' is measured with high precision.

For a sample having a complex shape, the three-dimensional shape of the sample may be measured using a plurality of measurement schemes. Alternatively, in place of a shape measurement apparatus of a fixedly placement type, a movable shape measurement apparatus may be used. A signal or data showing a result of the shape measurement is sent to the computation and control apparatus 12. In the present embodiment, the shape data of the sample 30' is generated by the computation and control apparatus 12 based on the result of the three-dimensional shape measurement of the sample 30'. Alternatively, the shape data of the sample 30' may be generated by the shape measurement apparatus 14.

Figure 2:
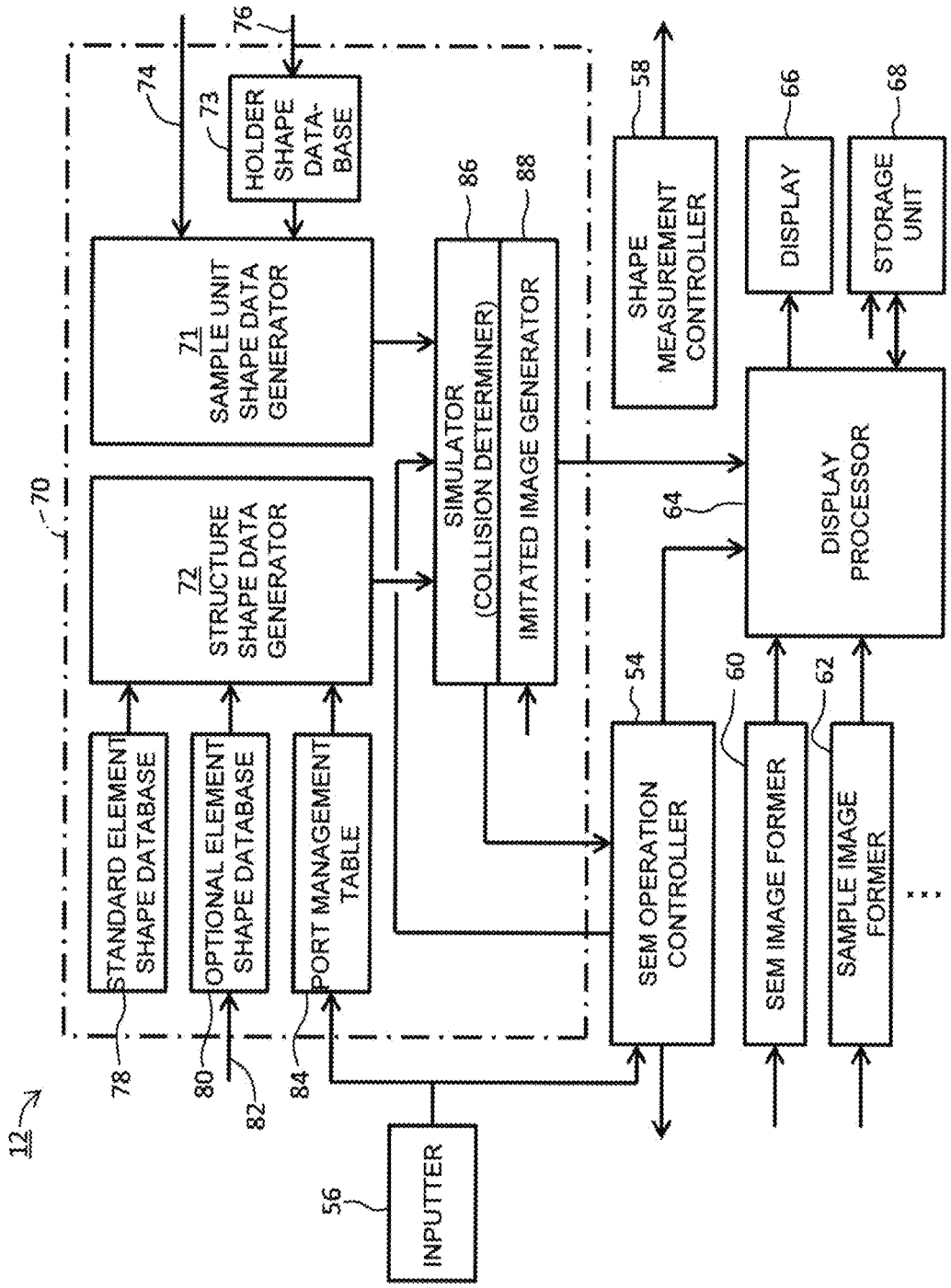
FIG. 2 is a block diagram showing an example structure of a computation and control apparatus.

FIG. 2 shows a specific structure of the computation and control apparatus 12 shown in FIG. 1. The computation and control apparatus 12 is formed by an information processor device such as a computer. Alternatively, the computation and control apparatus 12 may be formed by a plurality of information processor devices. In this case, the plurality of information processor devices are connected to each other via a network.

The computation and control apparatus 12 has a processor which executes a program, a plurality of storage units 68, 73, 78, 80, and 84, an inputter 56, a display 66, or the like. The inputter 56 includes a keyboard, a pointing device, or the like. The display 66 is formed from, for example, a liquid crystal display, an organic EL display, or the like. The inputter 56 functions as inputting means, and the display 66 functions as display means. In FIG. 2, a plurality of functions realized by the processor are expressed by a plurality of blocks. More specifically, the processor functions as an SEM operation controller 54, a shape measurement controller 58, an SEM image former 60, a sample image former 62, a display processor 64, a sample unit shape data generator 71, a structure shape data generator 72, a simulator 86, and an imitated image generator 88. The processor is formed from, for example, a CPU. Alternatively, the processor may be formed from a device other than the CPU. Alternatively, the plurality of the functions described above may be realized by a plurality of processors.

The SEM operation controller 54 is a controller which controls an operation of the scanning electron microscope. The control of the operation of the stage is performed by the SEM operation controller 54. The shape measurement controller 58 is a controller which controls an operation of the shape measurement apparatus. The SEM image former 60 forms an SEM image based on a detection signal acquired by scanning of the electron beam. Data of the formed SEM image is sent to the display processor 64. The display processor 64 has an image combining function, a display image forming function, or the like. A display image including the SEM image is displayed on a screen of the display 66. The SEM image is recorded in the storage unit 68 as necessary.

The sample image former 62 combines an optical image generated by imaging the sample by a camera, and a graphic image imitating the holder, and generates a sample image as a color image. More accurately, the sample image is a sample unit image. The image data of this image is sent to the display processor 64. The display image includes the sample image as necessary. In addition, images acquired by other cameras are displayed on the display 66.

The computation and control apparatus 12 in the present embodiment has a shape data processor 70. The shape data processor 70 has the sample unit shape data generator 71 and the structure shape data generator 72 in the configuration exemplified in the figures.

The sample unit shape data generator 71 functions as first shape data generating means, and generates shape data (first shape data) representing the three-dimensional shape of the sample unit. As described above, the sample unit is formed from the sample and the holder. In the present embodiment, the shape data representing the three-dimensional shape of the sample is generated at the sample unit shape data generator 71 based on a signal 74 from the shape measurement apparatus.

The storage unit 73 functions as a holder shape database. The storage unit 73 stores a plurality of shape data representing the three-dimensional shapes of a plurality of types of holders. Shape data corresponding to a holder which is currently being used is selected by a selection signal 76.

At the sample unit shape data generator 71, the shape data of the holder and the shape data of the sample are combined, to generate the shape data of the sample unit. Alternatively, the shape data of the sample unit may be generated not by such a combination, but based on the signal 74 from the shape measurement apparatus. The selection signal 76 is generated by a user designation or is automatically generated based on holder registration information or the like. The shape data of the sample unit is sent to the simulator 86 and to the imitated image generator 88.

The structure shape data generator 72 generates shape data (second shape data) representing the three-dimensional shape of the structure. The structure shape data generator 72 functions as a second shape data generating means. In the present embodiment, a plurality of shape data corresponding to a plurality of the elements placed in the sample chamber are combined to generate the shape data of the structure. The shape data is sent to the simulator 86 and to the imitated image generator 88.

In order to generate the plurality of shape data forming the shape data of the structure, the storage units 78, 80, and 84 are provided. The storage unit 78 functions as a standard element shape database, and stores a plurality of shape data corresponding to a plurality of standard elements. Each individual standard element is an element which is permanently placed in the sample chamber; that is, an element which is fixedly placed. The storage unit 80 functions as an optional element shape database, and stores a plurality of shape data corresponding to a plurality of optional elements. Each individual optional element is an element placed in the sample chamber as necessary. A selection signal 82 is a signal for specifying an optional element to be used, and shape data corresponding to the optional element to be used is read from the storage unit 80.

The storage unit 84 stores a port management table. The port management table is a table for managing a usage state of a plurality of ports provided in the sample chamber. One or a plurality of ports which are currently being used and one or a plurality of optional elements attached to the used ports are specified by referring to the port management table. The port management table records information from the inputter 56 as necessary. Alternatively, the recording may be automated.

The structure shape data generator 72 generates the shape data of the structure by referring to contents of the storage units 78, 80, and 84. More specifically, the structure shape data generator 72 spatially combines the plurality of shape data corresponding to the plurality of standard elements, and one or a plurality of shape data corresponding to one or a plurality of optional elements, to generate the shape data of the structure. When no optional element is used, the shape data of the structure is generated by the plurality of shape data corresponding to the plurality of standard elements.

The simulator 86 functions as simulating means and collision determining means. More specifically, the simulator 86 moves, as a virtual trial, the sample unit in the sample chamber prior to the actual movement of the sample unit, based on the shape data of the structure, the shape data of the sample unit, and the movement information of the sample unit, to determine presence or absence of the collision. For example, when these shape data spatially cross, a collision is determined. Alternatively, a simulation may be executed while adding a margin to any of the data in consideration of a shape measurement error and a computation error, and a theoretical collision may be thereby determined. The movement information is sent from the SEM operation controller 54 to the simulator 86. A signal indicating the presence or absence of the collision is sent from the simulator 86 to the SEM operation controller 54.

The movement information of the sample unit is information showing coordinates of a movement destination of the sample unit, and more specifically is information showing an X coordinate, a Y coordinate, a Z coordinate, a tilt angle, and a rotational angle. The movement information may alternatively be considered movement information of the stage. When the collision is determined, the movement information is invalidated; that is, movement of the sample unit is prohibited. When the collision is not determined, the movement information is validated, the sample unit is moved according to the movement information, and a new position and a new orientation of the sample unit are determined. The position information may be optimized based on an observation position on the sample, the sample unit shape data, and the structure shape data. That is, a condition which makes the movement of the sample close to the objective lens possible may be automatically computed.

The imitated image generator 88 functions as imitated image generating means. The imitated image generating means generates an imitated image imitating and three-dimensionally representing the inside of the sample chamber based on the position information of the sample unit, the shape data of the sample unit, and the shape data of the structure. In the present embodiment, an imitated image showing a current state inside the sample chamber is generated. Alternatively, an imitated image showing the inside of the sample chamber in the future after the movement of the sample unit may be generated.

In the present embodiment, the sample unit shape data and the structure shape data are combined, and the combined shape data thus generated is rendered, to generate the imitated image three-dimensionally representing the objects. As a method of rendering, a volume rendering method, a surface rendering method, or the like may be exemplified. Alternatively, the sample unit shape data and the structure shape data may be separately rendered, and then, the two rendered images thus generated may be combined to generate the imitated image.

The generated imitated image is sent from the imitated image generator 88 to the display processor 64. The display processor 64 generates a display image including the imitated image. The display image is displayed on the display 66. The imitated image is stored in the storage unit 68 as necessary. For example, in correlation to an SEM image, the imitated image showing the inside of the sample chamber when the SEM image is acquired is stored.

Figure 3:
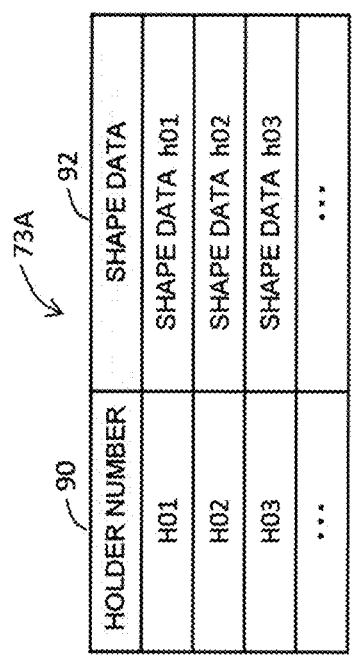
FIG. 3 is a diagram showing an example of a holder shape database.

FIG. 3 shows an example configuration of the holder shape database. A holder shape database 73A shown in FIG. 3 is formed from a plurality of records, each record having shape data 92 correlated with a holder number 90. According to the holder shape database 73A, the shape data of the holder can be acquired by designating the holder number showing a type of the holder which is actually used.

Figure 4:
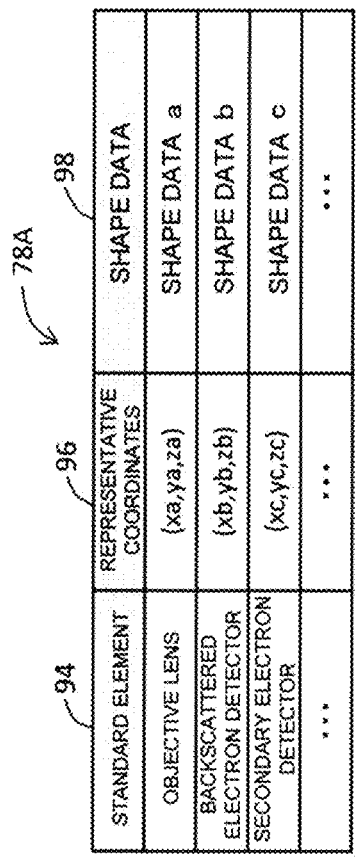
FIG. 4 is a diagram showing an example of a standard element shape database.

FIG. 4 shows an example configuration of the standard element shape database. A standard element shape database 78A shown in FIG. 4 is formed from a plurality of records, each record having representative coordinates 96 correlated with information for identifying a standard element 94 and shape data 98. The representative coordinates 96 show a position where the shape data 98 is to be mapped when the shape data 98 is spatially combined. Alternatively, the representative coordinates may include information for specifying a direction or an orientation. As the coordinate system, a relative coordinate system serving as a sample chamber coordinate system may be employed. Each individual standard element is permanently provided, and, during the generation of the structure shape data, reference is made to the shape data of all standard elements.

Figure 5:
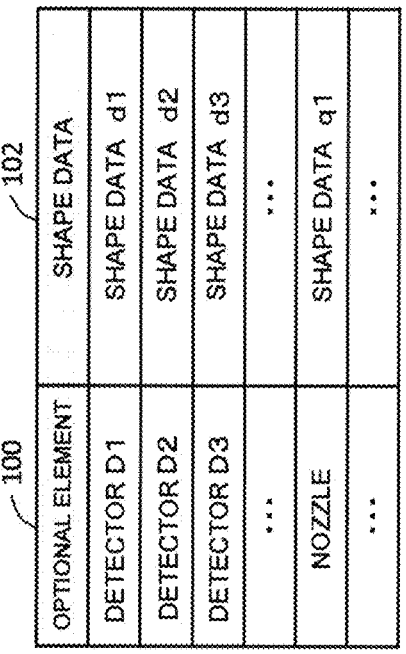
FIG. 5 is a diagram showing an example of an optional element shape database.

FIG. 5 shows an example configuration of the optional element shape database. An optional element shape database 80A shown in FIG. 5 is formed from a plurality of records, each record including shape data 102 correlated with information 100 for identifying the optional element. The position and the orientation of the optional element are determined when the optional element is installed on a particular port. Thus, each record does not necessarily include representative coordinates, but alternatively, information showing a positional relationship between the port and the optional element may be managed on the optional element shape database 80A as necessary.

Figure 6:
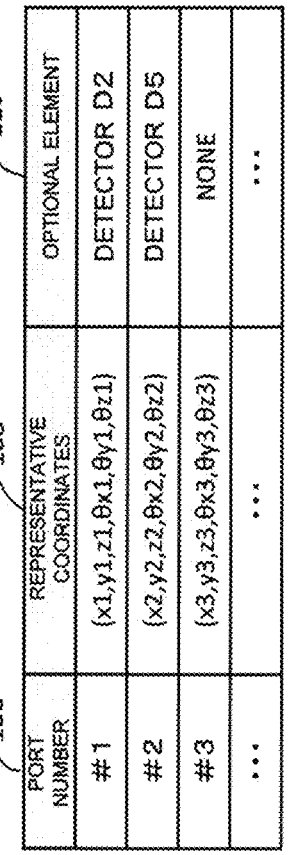
FIG. 6 is a diagram showing an example of a port management table.

FIG. 6 shows an example configuration of the port management table. A port management table 84A shown in FIG. 6 is formed from a plurality of records, each record including representative coordinates 108 correlated to a port number 106 and information 110 for identifying the optional element. According to the port management table 84A, the representative coordinate of the port which is being used can be specified by designated the port number of the used port, and, in addition, the optional element being used can be specified. The shape data of the optional element is acquired from the optional element shape database shown in FIG. 5.

FIG. 7 shows an example configuration of an image database constructed in the storage unit 68 shown in FIG. 2. An image database 112 shown in FIG. 7 is formed from a plurality of records, each record having a plurality of pieces of information correlated to an SEM image ID 113. The plurality of pieces of information include a measurement condition (acceleration voltage or the like) 114, stage coordinates 116, and an imitated image identifier 118. With this configuration, during a replay of the SEM image, the inside of the sample chamber at the time of the measurement can be reproduced, and the stage position at the time of the measurement can also be reproduced.

Figure 8:
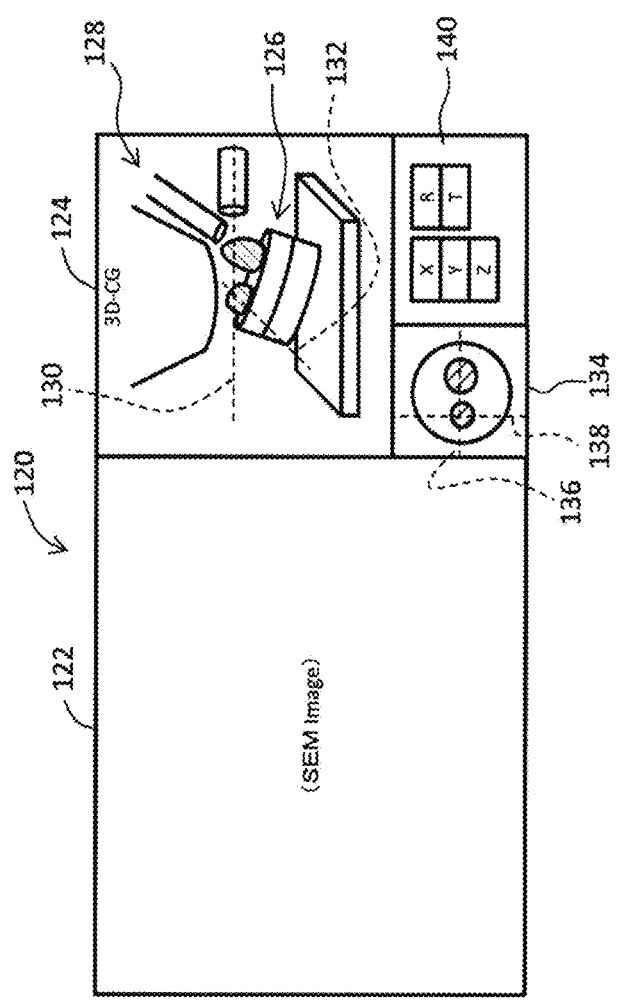
FIG. 8 is a diagram showing an example of a display image.

FIG. 8 shows an example of a display image displayed on the display. A display image 120 shown in FIG. 8 includes an SEM image 122, an imitated image 124, a sample image 134, a coordinate designator 140, or the like. The imitated image 124 is a three-dimensional CG (computer graphics) image reproducing the inside of the sample chamber at the time of acquisition of the SEM image 122. The imitated image 124 is shown in FIG. 8 in a simplified manner.

The imitated image 124 includes a sample unit object 126 and a structure object 128. In addition, markers 130 and 132 for specifying the coordinates of an observation point are included on the imitated image 124. Alternatively, a next observation point may be designated on the imitated image 124. Alternatively, a display element showing the electron beam may be included in the imitated image 124. When the position information of the sample unit is validated and updated, contents of the imitated image 124 are also updated accordingly, in real time.

The sample image 134 is a combined image formed from an optical image of the sample and a graphic image of the holder. Alternatively, a coordinate of an observation point may be designated on the sample image 134 by markers 136 and 138. A coordinate of the observation point is designated by the user using the coordinate designator 140. In this case, a clicking operation with respect to a coordinate display element may be performed or a numerical value may be input as the coordinate.

When the movement information of the sample unit (that is, the stage) is supplied, a simulation of movement of the sample unit is executed. If the collision is not determined as a result, the movement information is validated and the sample unit is actually moved according to the movement information. On the other hand, if the collision is determined, the movement information is invalidated, and the movement of the sample unit is prohibited. The movement information may be designated directly by the user, or the movement information may be computed based on the designation of the coordinates of the observation point by the user.

Figure 9:
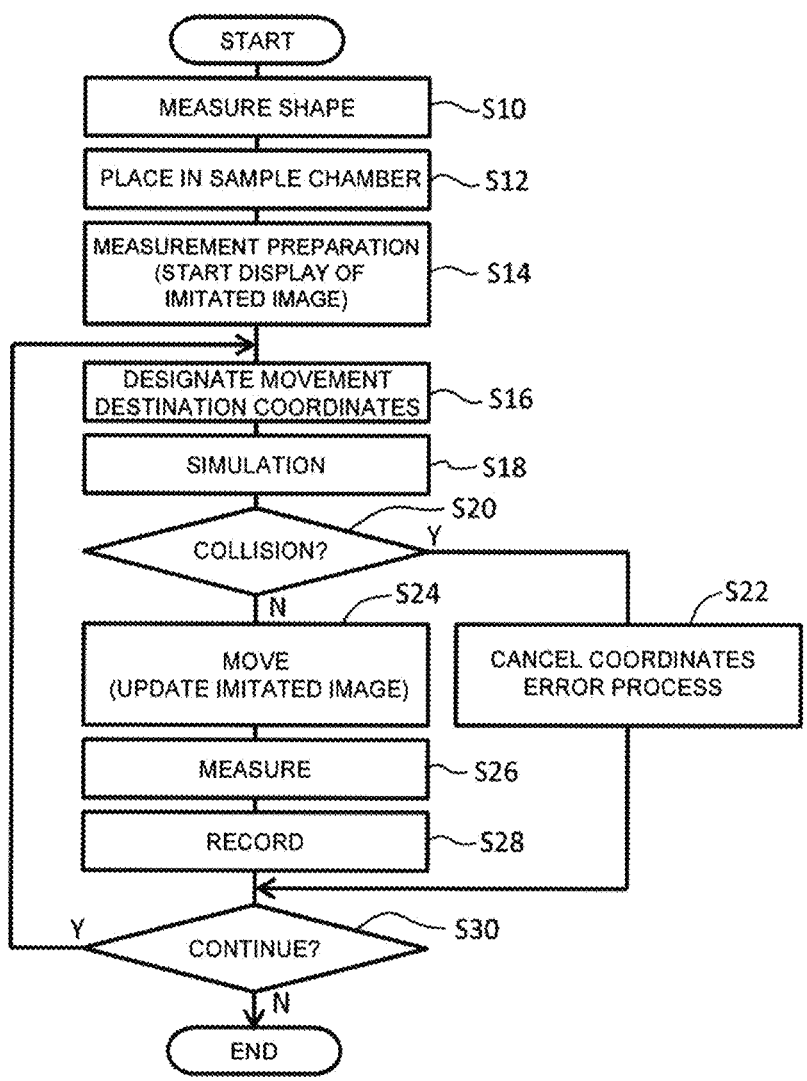
FIG. 9 is a flowchart showing a first example operation.

FIG. 9 shows a first example operation of the scanning electron microscope system shown in FIG. 1. Operations of detailed structures are not shown.

In S10, the sample unit is set with respect to the shape measurement apparatus by the user, and then, the three-dimensional shape of the sample is measured by the shape measurement apparatus. The measurement result is sent from the shape measurement apparatus to the computation and control apparatus. In S12, the sample unit is placed in the sample chamber by the user. Specifically, the sample unit is attached onto the stage. S14 is a measurement preparation step, and, in this step, air in the sample chamber is discharged, and the sample unit is positioned at an initial position. In S14, an imitated image is generated as a CG image by the computation and control apparatus, and display of the imitated image is started. The inside of the sample chamber is displayed as the imitated image.

In S16, a movement destination coordinate of the sample unit is designated. Normally, the movement destination coordinate is designated by the user, but alternatively, the movement destination coordinates may be automatically computed. In S18, a simulation is executed. The sample unit is virtually moved in the sample chamber, and a determination is made as to whether or not the sample unit collides with the structure during the movement. If the collision occurs, the process proceeds from S20 to S22. In S22, the movement destination coordinates are cancelled, and the movement of the sample unit is prohibited. Moreover, as an error process, a message indicating that a collision is predicted is displayed on the screen. In this process, an alarm sound may also be output.

If no collision occurs, the process proceeds from S20 to S24. In S24, the sample unit is actually moved according to the movement destination coordinate. During this process, the imitated image is updated. Then, in S26, irradiation and scanning of the electron beam with respect to the sample are executed, and the SEM image is thereby formed and displayed. In S28, the SEM image and the imitated image are stored in the image database. In S30, if continuation of the process is judged, the steps from S16 and on are repeatedly executed.

According to the example operation described above, when the movement destination coordinate is designated as the movement information, the simulation is executed prior to the actual movement of the sample unit, and presence or absence of the collision is determined. Because the movement of the sample unit is restricted when the collision is predicted, the collision can be prevented in advance. In the related art, there have been cases where the sample cannot be moved close to the objective lens due to the concern of the collision, but according to the example operation described above, the sample can be moved closer to the objective lens. Alternatively, optimum movement destination coordinates may be computed based on the designation of an observation point, and the movement of the sample unit may be controlled according to the optimum movement destination coordinates.

Figure 10:
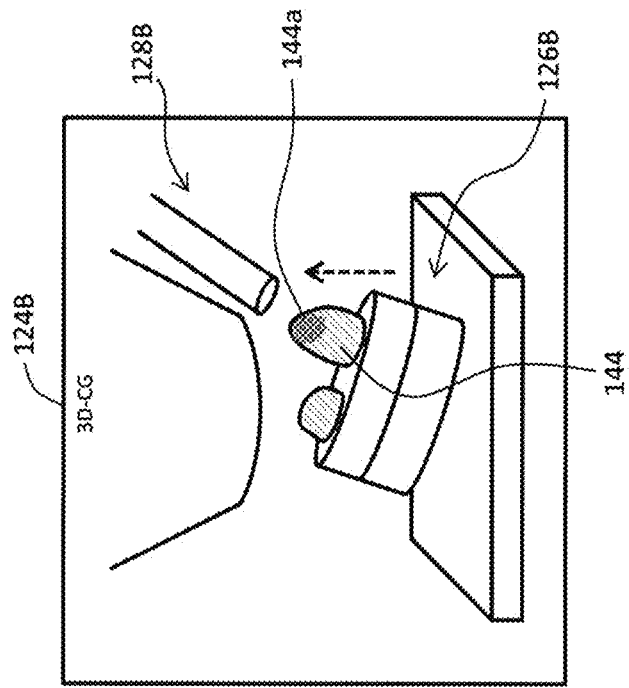
FIG. 10 is a diagram showing a first example of a method of expressing collision.
Figure 11:
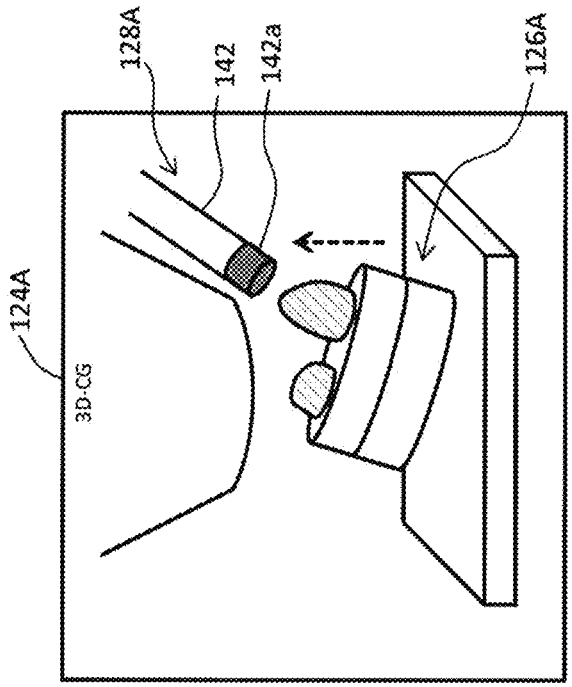
FIG. 11 is a diagram showing a second example of a method of expressing collision.

FIGS. 10 and 11 show example displays of the collision determination result. In a first example display shown in FIG. 10, an imitated image 124A includes a sample unit object 126A and a structure object 128A. The structure object 128A includes a detector object 142. As a result of the simulation, it is determined that the sample collides with a tip of the detector, and a tip 142*a* of the detector object 142 is identifiably expressed, reflecting the determination result. For example, the identifiable expression may be a coloring process, a highlight process, or the like. Alternatively, a degree of danger may be expressed by a color phase. Based on such information, the detector may be detached, or the holder may be exchanged.

In a second example display shown in FIG. 11, an imitated image 124B includes a sample unit object 126B and a structure object 128B. The sample unit object 126B includes a sample element object 144 representing a sample element. As a result of the simulation, collision of the sample element with the detector is determined, and an upper end 144*a* of the sample element object 144 is identifiably expressed, reflecting the determination result. Based on such information, the sample may be re-machined. Alternatively, an identification process may be applied to two portions which are in the collision relationship.

FIG. 12 shows an alternative configuration of the shape measurement. In the internal space 18A of the sample chamber 18, the sample unit 26 is attached to the stage 24. In the internal space 18A, a shape measurement apparatus 150 is provided. The shape measurement apparatus 150 is an apparatus which measures a three-dimensional shape of the sample or the sample unit by scanning of laser light. In the measurement of the three-dimensional shape, the sample unit is rotated around a center axis thereof (refer to reference numerals 26B and 152). This rotation can be realized by a function of the stage. Alternatively, the three-dimensional shape may be measured by an existing optical camera or a dedicated optical camera.

FIG. 13 shows a second example operation of the scanning electron microscope system shown in FIG. 1. Steps similar to those shown in FIG. 9 are assigned the same reference numerals, and will not be described again.

In the second example operation, in S32, prior to a designation of a movement destination coordinate in S34, the simulation is executed in advance. In other words, the entire coordinate range where collision occurs (collision coordinate range) is searched in advance, based on the movable range of the stage. When the movement destination coordinates are designated in S34, in S36, judgment is made as to whether or not the movement destination coordinates belong to the collision coordinate range specified in advance. When the movement destination coordinates belong to the collision coordinate range, S22 is executed. When the movement destination coordinates do not belong to the collision coordinate range, the processes from S24 and on are executed.

In the second example operation, the simulation in S32 requires a long period of time, but an advantage can be obtained in that the collision presence/absence determination in S36 can be executed quickly. On the other hand, according to the first example operation, the simulation can be executed for the movement destination coordinates which are actually designated, resulting in a smaller amount of computation. Alternatively, the structures shown in the figures may be employed in charged particle beam systems other than the scanning electron microscope system.

The invention claimed is:

1. A charged particle beam system comprising:
   first shape data generating means that generates first shape data which represents a three-dimensional shape of a sample based on a result of three-dimensional shape measurement of the sample;
   a sample chamber inside of which a sample unit including the sample is placed, for measurement by a charged particle beam;
   a first storage unit that stores a port management table for managing one or a plurality of optional elements which are installed on a group of ports provided to the sample chamber;
   second shape data generating means that generates second shape data which represents a three-dimensional shape of a structure which exists in the sample chamber, wherein the structure comprises at least one standard element which is fixedly placed in the sample chamber and the one or the plurality of optional elements which are installed on the group of ports;
   control means that controls movement of the sample unit in the sample chamber based on the first shape data and the second shape data;
   a second storage unit that stores a plurality of shape data which represent three-dimensional shapes of a plurality of standard elements which are fixedly placed in the sample chamber;
   a third storage unit that stores a plurality of shape data which represent three-dimensional shapes of a plurality of optional elements which can be installed on the group of ports,
   wherein the port management table manages one or a plurality of used ports selected from among the group of ports, and manages one or the plurality of optional elements installed on the one or the plurality of used ports and wherein
   the second shape data generating means generates the second shape data by referring to the first storage unit, the second storage unit, and the third storage unit.

2. The charged particle beam system according to claim 1, wherein
   the control means controls the movement of the sample unit in the sample chamber such that the sample unit does not collide with the structure.

3. The charged particle beam system according to claim 2, wherein
   the control means comprises:
   simulation means which executes a simulation for virtually trying movement of the sample unit based on movement information of the sample unit prior to movement of the sample unit in the sample chamber; and
   a determining unit which determines collision of the sample unit with the structure based on a result of execution of the simulation, and
   when the collision is determined, the movement of the sample unit is prohibited.

4. The charged particle beam system according to claim 1, wherein
   the first shape data is data which represents a three-dimensional shape of the sample unit which is formed from the sample and a holder which holds the sample.

5. The charged particle beam system according to claim 1, further comprising:
   imitated image generating means that generates an imitated image which shows a spatial relationship between the structure and the sample unit, based on movement information of the sample unit, the first shape data, and the second shape data; and
   display means that displays the imitated image.

6. The charged particle beam system according to claim 5, wherein
   the imitated image generating means updates the imitated image according to update of the movement information of the sample unit.

7. The charged particle beam system according to claim 5, wherein
   the imitated image includes a sample unit object corresponding to the sample unit and a structure object corresponding to the structure, and
   when collision between the sample unit and the structure is determined prior to the movement of the sample unit, the imitated image generating means reflects a result of the determination in at least one of the sample unit object and the structure object.

8. A method of measuring a sample using a scanning electron microscope, the method comprising:
   executing a three-dimensional shape measurement of a sample before or after a sample unit including the sample is placed inside a sample chamber of a scanning electron microscope;
   generating first shape data which represents a three-dimensional shape of the sample based on a result of the three-dimensional shape measurement;
   managing one or a plurality of optional elements which are installed on a group of ports provided to the sample chamber with a port management table stored in a first storage unit;
   generating second shape data which represents a three-dimensional shape of a structure which exists in the sample chamber, wherein the structure comprises at least one standard element which is fixedly placed in the sample chamber and the one or the plurality of optional elements which are installed on the group of ports;
controlling movement of the sample unit in the sample chamber based on the first shape data and the second shape data; and
observing the sample using an electron beam after movement of the sample unit in the sample chamber,
wherein a second storage unit stores a plurality of shape data which represent three-dimensional shapes of a plurality of standard elements which are fixedly placed in the sample chamber,
wherein a third storage unit stores a plurality of shape data which represent three-dimensional shapes of a plurality of optional elements which can be installed on the group of ports,
wherein the port management table manages one or a plurality of used ports selected from among the group of ports, and manages one or the plurality of optional elements installed on the one or the plurality of used ports, and
wherein the second shape data is generated by referring to the first storage unit, the second storage unit, and the third storage unit.

* * * * *